United States Patent [19]

Holl et al.

[11] Patent Number: 5,395,650
[45] Date of Patent: Mar. 7, 1995

[54] SELECTIVE, LOW-TEMPERATURE CHEMICAL VAPOR DEPOSITION OF GOLD

[75] Inventors: Mark M. B. Holl, Providence, R.I.; Steven P. Kowalczyk; Fenton R. McFeely, both of Ossining, N.Y.; Paul F. Seidler, Ridgefield, Conn.

[73] Assignee: International Business Machines Corporation, Armonk, N.Y.

[21] Appl. No.: 154,681

[22] Filed: Nov. 19, 1993

Related U.S. Application Data

[63] Continuation of Ser. No. 946,275, Sep. 16, 1992, abandoned.

[51] Int. Cl.$^6$ .............................................. C23C 16/00
[52] U.S. Cl. ..................................... 427/250; 427/125; 427/252; 427/255; 427/255.7; 427/265; 427/266; 427/301; 427/307; 427/405; 427/534; 427/535
[58] Field of Search ............... 427/125, 534, 535, 307, 427/405, 301, 250, 252, 255, 255.7, 265, 266

[56] References Cited

U.S. PATENT DOCUMENTS 4,714,627 12/1987 Puddephatt et al. ............... 427/125
5,019,531 5/1991 Awaya et al. ...................... 427/125

FOREIGN PATENT DOCUMENTS 3060112 5/1991 European Pat. Off. .
3916622 11/1989 Germany .

OTHER PUBLICATIONS

S. J. Kirch et al., "Spontaneous Decomposition of Dimethyl Gold . . . ", J. Vac. Sci. Technol., A8(5), Sep.-/Oct. 1990, pp. 3701-3705.
Colgate et al., "Area Selective Metalorganic Chemical Vapor Deposition of Gold on Tungsten Patterned on Silicon", J. Vac. Sci. Tech., A8(3), May/Jun. 1990.

*Primary Examiner*—Michael Lusignan
*Assistant Examiner*—David M. Maiorana
*Attorney, Agent, or Firm*—Daniel P. Morris

[57] ABSTRACT

Gold can be selectively deposited onto a catalytically-activated region on a surface of a workpiece in the presence of a catalytically-inactive region on the surface by a chemical vapor deposition method. The method involves placing the workpiece in a vacuum chamber and evacuating the vacuum chamber to a base pressure equal to or less than a catalyst-activity-preserving upper pressure limit to eliminate effectively gaseous catalyst-deactivating contaminants from the chamber. The surface composition of at least one region of a target surface of the workpiece is altered to produce a catalytically-activated region on the target surface. At least one region of the target surface disjoint from the catalytically-activated region is a catalytically-inactive region. A gaseous alkylated (trialkylphosphine)gold compound is introduced into the vacuum chamber to expose the target surface of the workpiece to the compound. The vacuum chamber is essentially continuously evacuated during exposure of the target surface to the gold-containing compound to maintain the vacuum chamber effectively free of gaseous catalyst-deactivating contaminants and to sweep gaseous reaction products from the vacuum chamber. The vacuum chamber is maintained effectively free of gaseous reducing agents during exposure of the target surface to the gold-containing compound. The target surface of the workpiece is maintained at a selective-deposition temperature which is effective to induce the gaseous gold-containing compound to deposit gold on the catalytically-activated regions of the target surface and to inhibit the compound from depositing gold on the catalytically-inactive regions of the target surface.

20 Claims, 4 Drawing Sheets

SELECTIVE, LOW-TEMPERATURE CHEMICAL VAPOR DEPOSITION OF GOLD

This is a file wrapper continuation of application Ser. No. 07/946,275, filed Sep. 16, 1992, now abandoned.

FIELD OF THE INVENTION

The present invention broadly concerns the chemical vapor deposition of metallic gold, and more particularly concerns the selective chemical vapor deposition of gold onto regions of a certain composition on a substrate in the presence of regions of a certain different composition.

BACKGROUND ART

Controlled, area-selective deposition of electrically conductive metal is important for a wide range of electrical applications, particularly in the manufacture of semiconductor integrated circuits and other microelectronic devices. In the manufacture of microelectronic devices, metal deposition is used to fabricate metal features such as contacts, interconnects, and interlayer wiring in multilayer circuits.

In recent years, the dimensions of metal features in semiconductor integrated circuits have been made progressively smaller, and even further reductions in the dimensions are contemplated for the future. In addition, metal features in microelectronic devices have been made increasingly complex. For example, in certain multilayer circuits, metal connections with high aspect ratios are required between the layers of the circuits. In general, the increasing complexity and ever smaller dimensions of metal features in microelectronic devices strain or exceed the capabilities of conventional methods to produce such features.

In addition to metal features of small dimensions, present day semiconductor integrated circuits frequently have doping profiles which change abruptly over short distances. To maintain such abrupt doping profiles during the processing required to fabricate the integrated circuit, the maximum temperature to which the integrated circuit can be exposed must be limited to limit thermal diffusion of the dopants. In addition, interdiffusion between the metal of a metal feature on a semiconductor integrated circuit and the semiconductor material in contact with the feature can be a problem if the integrated circuit is heated to an excessively high temperature during fabrication. For certain semiconductor integrated circuit technologies, it is necessary to limit the temperature to which the integrated circuits are exposed during processing to temperatures of less than 350° C. or so. Even lower maximum temperature limits may be desirable for the future.

Gold has been used to fabricate metal features in semiconductor integrated circuits because of its high electrical conductivity, excellent chemical stability, and low tendency toward electromigration. Since gold has a propensity to diffuse into silicon, an intermediate layer of tungsten or similar refractory metal is often used in silicon integrated circuits as a diffusion barrier between the gold of a gold metal feature and a silicon substrate on which the gold feature is located.

Gold films and wires for microelectronic devices have been produced by a variety of methods. Conventional vacuum evaporation and sputtering of gold have been used to produce gold metal features in microelectronic devices. Vacuum evaporation and sputtering are ordinarily line-of-sight physical techniques and require masks to accomplish area-specific deposition. In general, line-of-sight deposition techniques do not provide good conformal coverage. Moreover, because of the value of gold, gold which deposits on the mask is usually recovered, which results in additional process steps and tends to limit the life of the mask.

Certain conventional chemically driven methods for depositing gold are capable of conformal coverage and area selectivity without the use of a mask. For example, in the chemically driven technique of wet electroless deposition of gold, area selectivity can be obtained in certain cases through reactions which are specific to different substrate materials. See generally Y. Okinaka in Electroless Plating, Mallory and Hajdu, eds. (American Electroplaters and Surface Finishers Society, Orlando, Fla., 1990) pages 401 through 420. However, conventional electroless deposition solutions for area-selective gold deposition are multicomponent solutions which ordinarily include solvents, reducing agents and other desired constituents-as well as undesired impurities which are difficult, if not impossible, to remove. Exposure of microelectronic devices to such multicomponent solutions in the course of depositing gold in the device can lead to contamination problems.

U.S. Pat. No. 4,714,627 to Puddephatt and Treurnicht disclosed a chemical vapor deposition (CVD) method for depositing gold onto a target surface using methyl(trimethylphosphine)gold(I), trimethyl(trimethylphosphine)gold(III), and certain other volatile organogold(I) and organogold(III) complexes. The method of the patent involved vaporizing the organogold complex under a vacuum and directing the vaporized complex into contact with a target surface heated to a temperature at or above the decomposition temperature for the complex. The organogold complex decomposed upon contacting the heated surface to deposit gold. According to column 7, lines 29 through 46 of the patent, when a glass tube containing a target disk was heated along with the disk to above the decomposition temperature of a particular isocyano-gold complex, gold metal was deposited both on the disk and on the walls of the tube. It was indicated that selective plating of the target disk could be achieved by selective heating of the target disk only.

An article by Thomas H. Baum in *Journal of the Electrochemical Society*, volume 134, pages 2616 through 2619 (October 1987) disclosed a laser-induced chemical vapor deposition technique for achieving area selective deposition of gold. A laser beam was focussed on a substrate to serve as a localized heat source. Dimethyl gold acetylacetonate absorbed on or colliding with the surface underwent a thermal decomposition to metallic gold with the liberation of volatile reaction products. According to the article, the surface temperature profile induced by laser heating of the substrate controlled the deposition. In general, laser-induced chemical vapor deposition is satisfactory for writing gold features no smaller than the width of the beam, but is not practical for complex scale circuits because of the time required to trace out the desired circuit with the laser beam. In addition, conventional laser-induced chemical vapor deposition ordinarily cannot produce gold structures with dimensions as small as desired or with cross-sectional aspect ratios as high as desired for present-day microelectronic devices. Conventional laser-induced chemical vapor deposition also typically leaves an undesirably high concentration of carbon or other impurities in the deposited gold.

U.S. Pat. No. 5,019,531 to Awaya and Arita disclosed a deposition procedure wherein gold was deposited by chemical vapor deposition from various organometallic complexes of gold. The organometallic complex together with a reducing gas such as hydrogen was directed onto a heated substrate. According to the patent, for substrates which had both surfaces of metal or metallic silicide and surfaces of oxide or nitride, gold deposited only on the surfaces of metal or metallic silicide. However, the requirement for the simultaneous presence of an organogold comlex and a gaseous reducing agent complicates the control of the deposition process. In some cases, moreover, a reducing gas can adversely affect existing structures on a substrate.

A publication by Colgate et al. in *Journal of Vacuum Science and Technology*, volume A8, pages 1411 through 1412 (May/June 1990) disclosed the area-selective chemical vapor deposition of gold on tungsten patterned on silicon using triethylphosphine gold chloride ($CH_3CH_2)_3PAuCl$). An n-doped silicon wafer bearing a polycrystalline tungsten pattern was degreased with isopropyl alcohol vapor and then exposed to a hydrogen plasma while heated to 500° C. in a chemical-vapor-deposition reactor. After the 500° C.-heating/hydrogen-plasma pretreatment, the pressure in the reactor was reduced to $1 \times 10^{-6}$ torr and the wafer in the reactor was exposed to triethylphosphine gold chloride vapor with the temperature of the wafer maintained at 500° C. According to the publication, the triethylphosphine gold chloride decomposed to deposit gold on the tungsten, whereas the decomposition was inhibited on the silicon. Gold films were reportedly grown on silicon surfaces that had been treated in aqueous hydrofluoric acid prior to deposition. It was stated that native oxide on silicon, which should be stable in the presence of a hydrogen plasma, seemed to be a factor in inhibiting deposition, while elimination of tungsten oxide aided the film growth on tungsten. Growth of gold films both on tungsten and on glass at temperatures below 200° C. was reported in the publication, with the growth on glass being characterized as much slower than the growth on tungsten. In general, the decomposition of triethylphosphine gold chloride is expected to yield gaseous chlorine-containing decomposition products, which are expected to be corrosive-particularly at the 500° C. temperature for which selective gold deposition on tungsten patterned on silicon was reported in the publication.

SUMMARY OF THE INVENTION

We have invented a method for the selective, low-temperature chemical vapor deposition of gold which avoids problems of the prior art noted above.

Broadly, according to the method of the invention, gold is selectively deposited from a gaseous alkylated trialkylphosphinegold compound onto a catalytically-activated region on a surface of a workpiece in the presence of a catalytically-inactive region on the surface.

The terms "catalytically activated" and "catalytically inactive" as applied to a surface region describe the facility by which the alkylated trialkylphosphinegold compound undergoes decomposition reaction on the surface region to deposit gold. Gold can be deposited on catalytically activated regions in preferred embodiments of the invention at a relatively low temperature as compared to the minimum temperature at which gold will deposit on corresponding surfaces which are catalytically inactive.

The method of the invention comprises the step of placing a workpiece in a vacuum chamber. The workpiece has a surface which defines a target surface.

The method further includes the step of evacuating the vacuum chamber to a base pressure equal to or less than a catalyst-activity-preserving upper pressure limit to eliminate effectively oxygen, water vapor, and other gaseous catalyst-deactivating contaminants from the chamber.

The method of the invention further includes the step of altering the surface composition of at least one region of the target surface to produce a catalytically-activated region on the target surface. The surface composition of the region may be altered, by way of examples without limitation, by depositing a suitable-catalytically-active metal on the region or by subjecting the region to a suitable plasma, ion-bombardment, or other cleaning treatment. At least one region of the target surface disjoint from the catalytically-activated region is a catalytically-inactive region.

The method of the invention also includes the step of introducing a gaseous alkylated trialkylphosphinegold compound into the vacuum chamber to expose the target surface of the workpiece to the compound.

The method of the invention further includes the step of substantially continuously evacuating the vacuum chamber during exposure of the target surface to the alkylated trialkylphosphinegold compound to maintain the vacuum chamber effectively free of catalyst-deactivating contaminants and to sweep gaseous reaction products from the vacuum chamber. The vacuum chamber is maintained effectively free of gaseous reducing agents during exposure of the target surface to the alkylated trialkylphosphinegold compound.

The method of the invention also includes the step of maintaining the target surface of the workpiece at a selective-deposition temperature effective to induce the gaseous alkylated trialkylphosphinegold compound to deposit gold on the catalytically-activated regions of the target surface and to inhibit the compound from depositing gold on the catalytically-inactive regions of the target surface.

Preferred alkylated trialkylphosphinegold compounds have the formula $RAuPR'_3$ or $R'_3AuPR''_3$, where R is a methyl, ethyl, n-propyl, isopropyl, or t-butyl group; R' is a methyl or ethyl group; and R" is a methyl or ethyl group. A preferred alkylated trialkylphosphine gold compound is trimethyl(trimethylphosphine)gold(III). Particularly preferred alkylated trialkylphosphinegold compounds include methyl(trimethylphosphine)gold(I) and ethyl(trimethylphosphine)gold(I).

Preferably, the catalytically-activated regions of the target surface are composed of a catalytically-activatable metal in a catalytically-activated state. In certain preferred semiconductor integrated-circuit applications of the invention, the metal is patterned to form a desired circuit pattern on the target surface. Transition metals such as cobalt, gold, copper, and chromium are preferred metals on which to deposit gold according to the present invention, with chromium being particularly preferred for many semiconductor integrated circuit applications.

Preferably, the catalytically-inactive regions of the target surface are composed of silicon dioxide or a polymeric material such as a polyimide polymer. Among the polyimide polymers, pyromellitic dianhydride oxydianiline ("PMDA-ODA") polyimide is particularly preferred.

The method of the invention may be carried out in a high vacuum system which includes a reaction chamber outfitted for chemical vapor deposition. For preferred embodiments of the invention, the walls of the reaction chamber may be maintained at room temperature. Preferably, inner wall surfaces of the reaction chamber are composed of a material such as stainless steel coated with a native oxide which tends to inhibit decomposition of the alkylated trialkylphosphinegold compound to prevent coating of the inner wall surfaces with gold.

The reaction chamber in which preferred embodiments of the chemical vapor deposition method of the invention is carried out should have a base pressure of less than about $1 \times 10^{-6}$ torr. For carrying out certain preferred embodiments of the invention, a reaction chamber having a base pressure of about $1 \times 10^{-8}$ torr or less is preferred. In certain cases, a reaction chamber with a base pressure of about $1 \times 10^{-9}$ torr or less is most preferable.

By subjecting the target surface of the workpiece to high vacuum conditions with a base pressure equal to or less than the catalyst-activity-preserving upper pressure limit appropriate to the catalytically-activated regions of the target surface and the gold-deposition reaction, such catalytically-activated regions of the target surface can be maintained the activated state. For example, in one preferred embodiment of the invention involving depositing chromium on a target surface under a vacuum and exposing the chromium so deposited to ethyl(trimethylphosphine)gold(I) at about 25° C., gold was observed to deposit satisfactorily when the base pressure of the vacuum was about $1 \times 10^{-9}$ torr, whereas under substantially identical conditions except for a base pressure of about $1 \times 10^{-8}$ torr, only trace amounts of gold were observed to deposit. In a second preferred embodiment of the invention involving depositing copper on a target surface under a vacuum and exposing the copper so deposited to ethyl(trimethylphosphine)gold(I) at about 25° C., gold was observed to deposit satisfactorily when the base pressure of the vacuum was about $1 \times 10^{-6}$ torr.

In certain preferred embodiments of the present invention, the surface composition of selected regions of the target surface is altered by depositing a patterned film of chromium or other catalytically-activatable metal on the surface by evaporation through a mask under suitable ultrahigh vacuum conditions. The surface of the metal film as initially deposited under the ultrahigh vacuum conditions can be free of oxide and carbon contaminants which would tend to inhibit the decomposition of the alkylated trialkylphosphinegold to deposit gold on the surface. The metal film as initially deposited would be in a catalytically-activated state. Maintenance of the target surface under the ultrahigh vacuum would tend to maintain the surface of the metal film in the catalytically-activated state. Exposing the target surface to a suitably purified gaseous alkylated trialkylphosphinegold compound in accordance with a preferred embodiment of the invention while maintaining a vacuum pumping rate sufficient to achieve ultrahigh vacuum conditions in the absence of the gaseous gold compound-i.e., under ultrahigh-vacuum-capacity pumping conditions-permits gold to be deposited on the surface of the metal film at the relatively low temperatures characteristic of the catalytically-activated state of the surface.

In other preferred embodiments of the invention, the surface composition of regions of the target surface of a workpiece consisting of a catalytically-activatable metal which had been exposed to oxygen and water vapor may be altered to place the regions in a catalytically activated state by subjecting the regions to a suitable surface-composition-altering cleaning process. Examples of such surface-composition-altering cleaning processes include certain plasma-treatment, certain ion-bombardment-treatment, and certain chemical-treatment cleaning processes. For example, an argon or hydrogen plasma generated with an electron cyclotron resonance source has been found to be suitable for cleaning cobalt, gold, chromium, and copper which had previously been exposed to oxygen and water vapor to a catalytically-activated state. As another example, ion bombardment by an argon-ion beam has been found to be suitable in certain cases for cleaning copper and chromium which had been exposed to oxygen and water vapor to a catalytically activated state. As yet another example, the surface composition of a region consisting of copper which had previously been exposed to oxygen and water vapor was altered to place the region in a catalytically-activated state by a chemical cleaning process involving heating the surface in the presence of hydrogen.

Certain metals such as tantalum and molybdenum which become coated with a native oxide when exposed to air are known to form electrically-conductive suboxides when heated under ultra-high-vacuum conditions. It appears to be possible to alter the surface composition of surfaces consisting of such metals which previously had been exposed to the atmosphere to place the surfaces in a catalytically-activated state by heating the surfaces under ultrahigh vacuum conditions. It appears to be unnecessary to subject the surface of tantalum or molybdenum metal which had previously been exposed to the atmosphere to a plasma-treatment, ion-bombardment-treatment, or chemical-treatment cleaning process to achieve a catalytically-activated state.

The selective-deposition temperature of the method of the invention is preferably less than about 350° C. The optimum selective-deposition temperature will depend on the nature of the catalytically-activated regions of the target surface, the nature of the catalytically-inactive regions of the target surface, and the nature of the alkylated trialkylphosphinegold compound. For selectively depositing gold on chromium in the presence of silicon dioxide from ethyl(trimethylphosphine)gold(I), a selective-deposition temperature in the range of from about 25° C. to about 100° C. is preferred. For selectively depositing gold on chromium in the presence of pyromellitic dianhydride oxydianiline polyimide polymer from ethyl(trimethylphosphine)gold(I), a selective-deposition temperature in the range of from about 25° C. to about 230° C. is preferred.

It is an advantage of preferred embodiments of the selective gold chemical-vapor-deposition method of the invention that a reducing-agent coreactant is not required during the time the alkylated trialkylphosphinegold compound is undergoing a decomposition reaction to deposit gold.

It is a further advantage of preferred embodiments of the invention that an etchant coreactant is not required during the time the alkylated trialkylphosphinegold compound is undergoing a decomposition reaction to deposit gold.

In preferred embodiments of the invention, the deposition of gold on the target surface of a workpiece can be reversibly inhibited by exposing the target surface to a gold-deposition-deactivation agent. Preferred reversible gold-deposition-deactivation agents include the Lewis acids boron trifluoride $BF_3$ and triethylboron $B(CH_2CH_3)_3$ and the Lewis base trimethylphosphine $P(CH_3)_3$. Boron trifluoride is particularly preferred. Surfaces for which gold deposition had been inhibited using a gold-deposition-deactivation agent may be reactivated to a catalytically-activated state by mild heating.

BRIEF DESCRIPTION OF THE DRAWINGS

Examples of preferred embodiments of the chemical-vapor-deposition method of the invention are set forth below in which reference is made to the following drawings.

EXAMPLES

Figure 1:
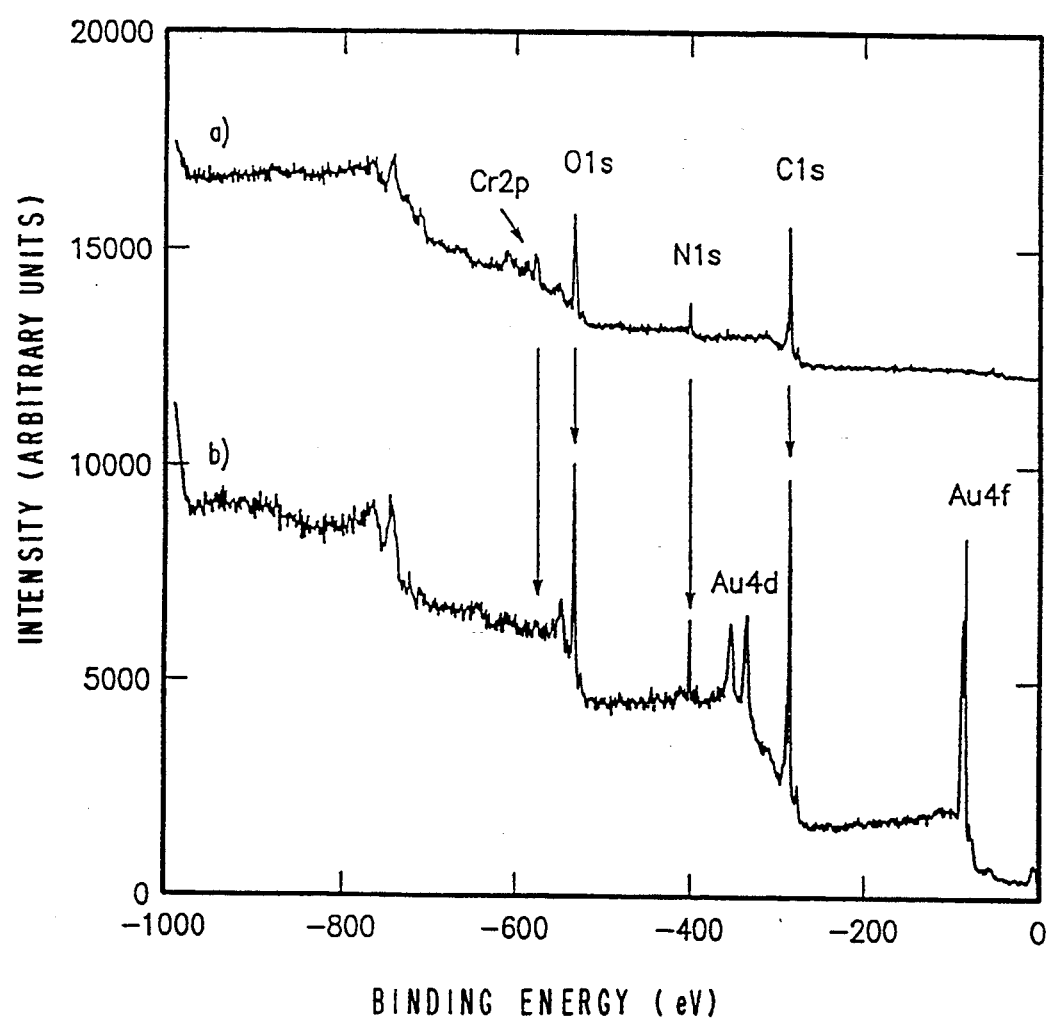
FIG. 1(a) shows an x-ray photoelectron spectrum of a patterned target surface having chromium dots disposed on a layer of PMDA-ODA polyimide.
FIG. 1(b) shows an x-ray photoelectron spectrum of the patterned target surface of FIG. 1(a) after exposure to ethyl(trimethylphosphine)gold(I) at about 25° C.

In the examples below, test-specimen substrates having target surfaces of various compositions as described below were exposed to the vapor of either ethyl(trimethylphosphine)gold(I) $CH_3CH_2AuP(CH_3)_3$ or methyl(trimethylphosphine)gold(I) $CH_3AuP(CH_3)_3$ under the conditions described. Whether or not gold deposited on the target surfaces under the experimental conditions was noted.

APPARATUS

Each example set forth below was carried out in one of two ultrahigh vacuum systems, designated a principal vacuum system and an auxiliary vacuum system. The principal vacuum system and the auxiliary vacuum system both included a reaction chamber. The principal vacuum system included in addition an analysis chamber connected to the reaction chamber by a transfer chamber.

The reaction chamber of each vacuum system was pumped by a turbomolecular pump having a pumping capacity of about 60 L/s and a titanium sublimator. The reaction chamber could be evacuated to a base pressure of less than about $1\times10^{-9}$ torr. Generally, after exposure to a volatile organometallic deposition agent, base pressures were about $5\times10^{-9}$ torr. The walls of the reaction chamber were maintained at room temperature during the deposition experiments. Any hot-filament gauges and other hot-filament devices in the reaction chamber were turned off during the depositions. The walls of the reaction chamber were made of stainless steel.

A deposition-agent ampoule was connected to a deposition-agent inlet port of the reaction chamber for storing a charge of a volatile deposition agent. A deposition-agent inlet valve was interposed between the deposition-agent ampoule and the deposition-agent inlet port. By maintaining the deposition-agent ampoule at a suitable temperature, deposition agent in the ampoule could be volatilized to a gaseous state by evaporation or sublimation. Opening the deposition-agent inlet valve permitted gaseous deposition agent to flow from the deposition-agent ampoule into the interior of the reaction chamber.

Sample transfers between the reaction chamber and the analysis chamber in the principal vacuum system were made in vacuo via the transfer chamber. The analysis and transfer chambers were each fitted with an ion pump and a titanium sublimator, and both chambers could be evacuated to base pressures of about $2\times10^{-10}$ torr.

Surface characterization of samples was performed in the analysis chamber of the principal vacuum system using an X-ray photoelectron spectroscopy ("XPS") spectrometer commercially available from ISA Riber, Division d'Instruments S. A. of Rueil-Malmaison, France under the trade designation "ES 150 MAC2." The XPS system employed MgK$\alpha$ X-rays with an energy of about 1253.6 eV. Samples were positioned approximately normal to the spectrometer axis, and electrons were collected at about 45° with respect to the surface normal with an imaged area of about $4\times10$ mm. The angle-integrating nature of the analyzer made it generally insensitive to the sample angle. Binding energies were calibrated using a separate gold foil sample stored in the analysis chamber and defined with a reference binding energy for Au $4f_{7/2}$ of about 83.8 eV. The XPS spectrometer exhibited a reproducibility of approximately $\pm0.1$ eV with respect to the Au $4f_{7/2}$ peak.

Some samples were subjected to additional characterization which required removal from the ultrahigh vacuum system and exposure to air. Gold film thicknesses were measured with a profilometer commercially available from Tencor Instruments of Mountain View, Calif. under the trade designation "Alpha-Step 200." Resistivity measurements were obtained with a digital resistance meter using a four-point probe commercially available from Magne-tron Instruments Division of Shiell Associates, Inc. of Menlo Park, Calif. under the trade designation "Model M-700." A scanning Auger microprobe commercially available from Physical Electronics of Eden Prarie, Minn. under the trade designation "Model 600" was employed for depth-profiling and area-selective Auger spectroscopy. Patterned substrates were examined using an x-ray photoelectron spectrometer commercially available from Surface Science Instruments of Mountain View, Calif. under the trade designation "SSX 301 XPS system," which permitted analysis of surface spot sizes of approximately 150 μm. Rutherford backscattering spectra could be obtained using a Rutherford backscattering spectrometer which employed helium ions at an energy of about 2.3 MeV.

PREPARATION OF TEST-SPECIMEN SUBSTRATES

Deposition reactions were carried out on test-specimen substrates which were generally rectangular in shape, with lateral dimensions of approximately 7×20 mm and thicknesses of about 0.38 mm. One of the larger generally rectangular faces of each test-specimen substrate served as a target surface. For most of the experiments described below, the test-specimen substrates were composed of essentially-single crystalline silicon. The target faces of the silicon test-specimen substrates were generally coated, although uncoated silicon target surfaces were used in certain cases. Test-specimen substrates of both p and n-type silicon were used and gave essentially identical results in all cases.

Silicon wafers approximately 76 mm (three inches) in diameter having an approximately [111] (±0.25°) crystallographic orientation were obtained commercially from Virginia Semiconductor Inc. of Fredericksburg, Va. The wafers as received had been pre-cleaned using an RCA process. The test-specimen substrates were cleaved from the silicon wafers and then rinsed with absolute ethanol. For a test-specimen substrate which was to be used uncoated or to be coated in vacuo in the reaction chamber, the test-specimen substrate was introduced into the reaction chamber and the chamber evacuated to an ultrahigh vacuum. The test-specimen substrate was then heated resistively to about 1000° C. in vacuo to clean the target face. No carbon or oxygen could be detected on the surfaces cleaned in this way by x-ray photoelectron spectroscopy, which had a sensitivity of less than about one atomic percent.

Test-specimen substrates of silicon having target surfaces coated with a thin layer of silicon dioxide were prepared with the silicon dioxide layers in two thicknesses: approximately 40 Å and approximately 5000 Å. To prepare a test-specimen substrate with a target surface coated with silicon dioxide approximately 40 Å thick, clean Si(111) substrates were exposed to approximately 0.1 torr of dioxygen ($O_2$) of greater than about 99.9995 percent purity for approximately 20 minutes at about 950° C. A coating of silicon dioxide film formed on essentially the entire outer surface of the test-specimen substrate, including the target surface. The substrate was cooled to ambient temperature in oxygen to avoid pinhole formation in the silicon dioxide coatings. The resulting silicon dioxide film had a thickness of approximately 40 Å. Test-specimen substrates of silicon having target surfaces coated with a silicon dioxide film about 5000 Å thick were obtained from silicon wafers coated with silicon dioxide to that thickness commercially available from Virginia Semiconductor. After cleaving to the desired dimensions, the silicon-dioxide-coated test-specimen substrates were rinsed with absolute ethanol prior to use.

Test-specimen substrates of silicon having target surfaces coated with pyromellitic dianhydride oxydianiline (PMDA-ODA) polyimide films approximately 2000 Å thick were prepared by spin casting a solution of polyamic acid in n-methyl pyrolidone onto the target surfaces and curing under dinitrogen ($N_2$) to about 400° C. The polyimide films so prepared could be used without further treatment. Polyimide films which had been degassed at about 350° C. for approximately 10 minutes in vacuo prior to use behaved identically with films which had not been subjected to such a degassing procedure.

Test-specimen substrates of silicon having target surfaces coated with a layer of chromium were prepared by depositing chromium on the substrates by sublimation in the reaction chamber. The sublimation of chromium was accomplished by heating ingots of arc-melted chromium in a resistively heated tungsten basket after the reaction chamber had been evacuated to a base pressure of about $2 \times 10^{-10}$ torr. Test-specimen substrates of silicon having a target surface coated with copper were prepared in a similar fashion from the evaporation of copper ingots in the reaction chamber.

Patterned substrate surfaces were created by depositing metal through a mask onto the target surfaces of silicon test specimen substrates which bore a coating of either silicon dioxide or PMDA-ODA polyimide. Specifically, to create a test specimen substrate bearing a patterned target surface, a stainless steel mask having openings of various diameters down to approximately 100 μm in diameter was placed against the target surface. The test-specimen substrate with the mask covering the target surface was then placed in the reaction chamber. Chromium or copper ingots were evaporated as described in the preceding paragraph. Evaporation of the chromium or copper through the mask was carried out until metal dots of a desired thickness—for example, approximately 30 Å thick—were deposited.

Starting Materials

Boron trifluoride with a purity of about 99.5 percent was obtained commercially from Matheson Gas Products of East Rutherford, N.J. and was vacuum transferred to a stainless steel ampoule. Test-specimen substrates coated with chromium were observed to oxidize when exposed to the boron trifluoride without further purification. Subjecting the boron trifluoride to four freeze-pump-thaw cycles on an ultrahigh vacuum manifold with a base pressure of about $2 \times 10^{-9}$ torr purified the boron trifluoride sufficiently to permit chromium to be exposed to the purified material substantially without oxidation.

Trimethylphosphine with a purity of about 97 percent was obtained from Aldrich Chemical Company, Inc. of Milwaukee, Wis. The trimethylphosphine was purified by subjecting it to three freeze-pump-thaw cycles on a vacuum manifold with a base pressure of about $1 \times 10^{-5}$ torr. The trimethylphosphine was then vacuum distilled from a sodium mirror into a stainless steel ampoule. The trimethylphosphine was then subjected to four freeze-pump-thaw cycles on an ultrahigh vacuum manifold with a base pressure of about $2 \times 10^{-9}$ torr.

Hydrogen tetrachloroaurate hydrate $HAuCl_4.3H_2O$ may be synthesized by the following procedure. In a round-bottom flask with a capacity of about 250 ml equipped with a magnetic stir bar, about 14.9 g of gold shot, which corresponds to about 75.8 mmol of gold, is mixed with about 75.0 ml concentrated hydrochloric acid HCl(aq) and about 25.0 ml concentrated nitric acid $HNO_3$(aq). After stirring for about 20.5 hr, the gold dissolves completely to form an orange solution. Volatiles are removed from the solution by vacuum transfer to produce a wet residue. A warm water bath at a temperature in the range from about 40° to about 70° C. may be used to speed evaporation. To flush $HNO_3$ from the product, the wet residue is redissolved in a minimum amount of concentrated hydrochloric acid HCl(aq), and then the volatiles are stripped again under vacuum while heating with a warm water bath. Flushing with concentrated hydrochloric acid HCl(aq) is repeated a second time to yield a solid orange residue. The solid residue is dried under dynamic vacuum overnight to produce $HAuCl_4 \cdot 3H_2O$, which corresponds to about 75.4 mmol of the product compound, and represents a yield of about 99.5 percent based on the gold starting material. The compound $HAuCl_4 \cdot 3H_2O$ is a strong oxidizing agent, so contact with metal objects such as stainless steel spatulas should be minimized in order to avoid product contamination.

Trimethylphosphinegold chloride $(CH_3)_3PAuCl$ may be prepared according to the following procedure. A three-necked round-bottom reaction flask of approximately 500 ml capacity is equipped with a magnetic stir bar, a gas inlet tube, and a pressure-equalizing addition funnel of approximately 250 ml capacity capped with a Suba-seal. The reaction flask is charged with approximately 29.7 g of hydrogen tetrachloroaurate hydrate $HAuCl_4 \cdot 3H_2O$, which corresponds to about 75.4 mmol of the gold compound, and about 100 ml of anhydrous ethanol EtOH from a fresh bottle. The pressure-equalizing addition funnel is filled with about 175 ml of anhydrous EtOH. Air is removed from the apparatus by flushing with argon-including bubbling argon through the EtOH-for about 30 min. Approximately 20.0 ml trimethylphosphine as received, which represents about 187 mmol of trimethylphosphine, is added via syringe to the addition funnel and mixed well with the EtOH therein. The resulting trimethylphosphine solution is added dropwise with stirring to the $HAuCl_4 \cdot 3H_2O$ solution in the reaction flask while the flask is cooled in an ice-water bath. A fluffy white precipitate is produced immediately. After stirring at room temperature for about one hour, volatiles are removed by vacuum transfer. The resulting product mixture is washed four times with cold water. Recrystallization from boiling acetone gives approximately 21.8 g of the final product compound $(CH_3)_3PAuCl$, which corresponds to about 70.5 mmol of the compound and represents a yield of about 93.5 percent based on $HAuCl_4 \cdot 3H_2O$). The proton nuclear magnetic resonance ("NMR") spectrum of the product in deuterated chloroform yields the following NMR spectral parameters: $\delta$ 1.610 (d, J=11.3 Hz) ppm.

Synthesis of Ethyl(trimethylphosphine)gold (I)

The organogold compound ethyl(trimethylphosphine)gold(I) $CH_3CH_2AuP(CH_3)_3$ may be prepared as follows:

A special filter-tube apparatus may be used in the preparation of $CH_3CH_2AuP(CH_3)_3$. The filter-tube apparatus includes a filter tube which comprises an approximately 2-cm inside-diameter glass tube with standard 14/20 joints on either end, divided crosswise at its approximate midpoint by a filter disk of medium sintered glass. A small-diameter pressure-equalization tube containing a "Teflon" valve extends between the ends of the filter tube, allowing pressure equalization across the filter disk when necessary. A side arm with a standard 14/20 joint at the end projects from the filter tube near one end of the filter tube. The side arm is used to attach the filter-tube apparatus to a vacuum line and also serves as a bearing about which the apparatus can be rotated.

A round-bottom reaction flask of approximately 250 ml capacity containing a magnetic stir bar is charged with about 9.26 g of trimethylphosphinegold chloride $(CH_3)_3PAuCl$, which corresponds to about 30.0 mmol of the compound. The reaction flask is attached to the filter-tube apparatus on the end nearest the side arm. The other end of the filter tube is fitted with a round-bottom product-receptacle flask of approximately 100 ml capacity containing a magnetic stir bar. The entire filter-tube apparatus is attached to a vacuum line via a "Teflon" vacuum-line needle valve.

Approximately 100 ml of diethyl ether previously dried over sodium/benzophenone is vacuum transferred into the reaction flask containing the $(CH_3)_3PAuCl$. The resulting slurry of $(CH_3)_3PAuCl$ is cooled in a salt/ice-water bath to about $-10°$ C. Under a strong argon purge, the "Teflon" plug is removed from the body of the vacuum-line needle valve and an aliquot of about 16.5 ml of approximately 2.0M ethyl magnesium chloride $CH_3CH_2MgCl$ in diethyl ether—which corresponds to about 33 mmol of the compound—is added via syringe through the needle-valve body to the $(CH_3)_3PAuCl$ slurry. After stirring at a temperature in the range from about $-13°$ to about $-7°$ C. for about 30 minutes, the reaction mixture is warmed to room temperature. The reaction mixture is then further stirred for approximately 70 minutes. Solvent is then removed by vacuum transfer to yield a gummy product residue in the reaction flask.

In order to flush diethyl ether from the gummy residue, an aliquot of about 50 ml of pentane which had been dried over sodium/benzophenone is vacuum transferred into the reaction flask. The pentane is mixed well with the product residue to form a slurry, and the volatiles stripped by vacuum transfer. The pentane flushing is repeated twice more.

The product compound, which is a viscous liquid soluble in pentane at room temperature, is then separated from solid, pentane-insoluble reaction by-products by a repeated pentane washing and filtering procedure. Specifically, an aliquot of about 40 ml of pentane is transferred into the reaction flask to dissolve liquid product, the filtering apparatus is rotated about the side arm to invert the reaction flask, and the undissolved solid material is filtered from the liquid material by the sintered-glass filter disk in the filter tube. With the apparatus still under vacuum and the valve in the pressure equalizing tube open, pentane from the filtrate is repeatedly recondensed in the inverted reaction flask to wash the solids remaining above the filter disk. Each such pentane wash is filtered through the sintered-glass filter disk and combined with the existing filtrate in the product-receptable flask. Washing is continued until little or none of the viscous liquid product remains in the inverted reaction flask to be washed through the filter disk.

Pentane is then removed from the filtrate in the product-receptacle flask by prolonged vacuum transfer, yielding about 7.66 g of the product compound $CH_3CH_2AuP(CH_3)_3$, which corresponds to about 25.3 mmol of the compound and represents a yield of about 84.4 percent based on $(CH_3)_3PAuCl$. The product is a clear, pale-brown, viscous liquid.

A proton NMR spectrum of the ethyl(trimethylphosphine)gold(I) product in deuterated benzene yielded the following NMR spectral parameters: $\delta$ 2.03 (complex multiplet, 5H), 0.55 (d, J=8.5 Hz, 9H) ppm.

The x-ray photoemission spectroscopy ("XPS") spectrum of the ethyl(trimethylphosphine)gold(I) product was measured by condensing a quantity of the product onto a (111) oriented surface of silicon at about 133° K. The observed Au $4f_{7/2}$, P 2p, and C 1s core levels had binding energies of 86.2, 132.6, and 286.2 eV, respectively. The measured binding energies were uniformly greater than those expected based upon previous XPS measurements of gold phosphine complexes. For example, the trimethylphosphine C 1s binding energy was expected to be approximately 285.3 eV. The difference between the observed values and those of previous reports may have been due to charging effects in the condensed film. Correcting the observed binding energies by an offset of 0.9 eV gave 85.3 eV and 131.7 eV for the Au $4f_{7/2}$ and P 2p peaks, respectively. Both of these values are in close agreement with previous reports on similar Au(I) species.

SYNTHESIS OF METHYL(TRIMETHYLPHOSPHINE)GOLD(I)

The organogold compound methyl(trimethylphosphine)gold(I) may be prepared as follows, making use of the same filter-tube apparatus as used in the preparation of ethyl(trimethylphosphine)gold(I). A round-bottom reaction flask of approximately 100 ml capacity containing a magnetic stir bar is charged with about 0.614 g of trimethylphosphinegold chloride $(CH_3)_3PAuCl$, which corresponds to about 1.99 mmol of the starting material. The reaction flask is attached to the filter tube apparatus on the end nearest the side arm. The other end of the filter tube is fitted with a round-bottom product-receptacle flask of approximately 50 ml capacity containing a magnetic stir bar. The entire apparatus is attached to a vacuum line via a "Teflon" vacuum-line needle valve. A charge of approximately 30 ml of diethyl ether, previously dried over sodium/benzophenone, is vacuum transferred into the reaction flask to form a slurry of trimethylphosphinegold chloride. The slurry is cooled in a salt/ice-water bath to about −10° C. Under a strong argon purge, the "Teflon" plug is removed from the body of the vacuum-line needle valve, and an aliquot of about 1.70 ml of approximately 1.4M methyllithium $CH_3Li$ in diethyl ether, which corresponds to about 2.4 mmol of $CH_3Li$, is added via syringe through the vacuum-line needle-valve body to the $(CH_3)_3PAuCl$ slurry in the reaction flask. After stirring at a temperature in the range of from about −12° to about −5° C. for approximately 30 min, the reaction mixture is warmed to room temperature and further stirred for approximately two hours. Solvent is then removed by vacuum transfer.

An aliquot of about 30 ml of pentane is transferred into the reaction flask to dissolve product for separation from pentane-insoluble by-products. The filter-tube apparatus is then rotated about the side arm to invert the reaction flask and filter the contents with the sintered-glass filter disk. With the apparatus still under vacuum and the valve in the pressure-equalizing tube open, pentane from the filtrate in the product-receptacle flask is condensed in the inverted reaction flask to wash the solid remaining above the sintered-glass filter disk. The pentane wash is filtered through the filter disk and combined with the existing filtrate in the product-receptacle flask. This washing procedure is repeated twice again.

Pentane is removed from the filtrate in the product-receptacle flask by prolonged vacuum transfer, yielding approximately 0.517 g of the final product methyl(trimethylphosphine)gold(I) $CH_3AuP(CH_3)_3$, which represents about 1.79 mmol of the product compound and corresponds to a yield of about 90.2 percent based on $(CH_3)_3PAuCl$. The product is a white, crystalline solid.

The proton NMR spectrum of the final product in deuterated benzene yielded the following spectral parameters: δ 1.24 (d, J=8.5, 3H), 0.57 (d, J=8.7 Hz, 9H) ppm.

The organogold compounds were stored in stainless steel ampoules held at room temperature. When introduced into the reaction chamber of the principal vacuum system under unthrottled flowing conditions, a reaction-chamber pressure of about $4.2 \times 10^{-6}$ torr was measured for the ethyl(trimethylphosphine)gold(I) using a water-cooled ion gauge and a pressure of about $1.2 \times 10^{-6}$ torr was measured for the methyl(trimethylphosphine)gold(I). When ethyl(trimethylphosphine)gold(I) was introduced into the reaction chamber of the auxiliary vacuum system, the pressure was adjusted to either about $1.3 \times 10^{-4}$ or about $0.8 \times 10^{-4}$ torr by adjusting the deposition-agent inlet valve.

EXAMPLE 1

A series of test-specimen substrates having target surfaces composed of different materials were prepared essentially according to the procedures set forth above.

A first group of test-specimen substrates had target surfaces composed of freshly-deposited metal prepared by evaporation in the reaction chamber of the principal vacuum system under ultrahigh vacuum. The following metals were used: chromium and copper. Each of the test-specimen substrates of the first group was maintained in a reaction chamber under ultrahigh vacuum to prevent the freshly-deposited metal from oxidizing or otherwise becoming contaminated.

Test-specimen substrates having target surfaces composed of copper oxide, chromium oxide, cobalt oxide, or atmosphere-exposed gold made up the second group. The copper oxide and chromium oxide target surfaces were prepared by oxidizing test-specimen substrates having target surfaces composed of freshly-deposited copper and chromium, respectively, with air introduced into the reaction chamber at room temperature. Additional target surfaces of chromium oxide and copper oxide as well as target surfaces of cobalt oxide and atmosphere-exposed gold target surfaces were prepared by removing test-specimen substrates having target surfaces of freshly deposited chromium, copper, cobalt or gold, as the case may be, from the reaction chamber where the metal was deposited and exposing the surfaces to the ambient atmosphere.

A third group of test-specimen substrates had target surfaces composed of silicon dioxide, either about 40 Å thick or about 5000 Å thick.

The mounting hardware for the test-specimen substrates in the reaction chamber of the principal vacuum system constituted a fourth group of test-specimen materials. The mounting hardware was used to mount the silicon test-specimen substrates or to make electrical connection to the substrates for resistive heating. The mounting hardware was made of tantalum and molybdenum and, in the course of use, had been exposed to the ambient air. Portions of the tantalum or molybdenum mounting hardware in contact with the silicon test-specimen substrates became heated under ultrahigh vacuum conditions when the substrates were heated to about 1000° C. for cleaning. The heated surfaces of the tantalum or molybdenum hardware served as target surfaces. The target surfaces were not analyzed, so the exact composition of the surfaces was not known, although they were expected to be respectively tantalum or molybdenum suboxide as a result of heating the native oxide coating under the ultrahigh vacuum conditions.

Test-specimen substrates having target surfaces composed of pyromellitic dianhydride oxydianiline (PMDA-ODA) polyimide constituted a fifth group of test-specimen substrates.

Finally, test-specimen substrates having target surfaces of substantially (111)-oriented silicon or (100)-oriented germanium constituted a sixth group of test-specimen substrates.

In the first example, a target surface of each composition was exposed in turn to the compound ethyl(trimethylphosphine)gold(I) $CH_3CH_2AuP(CH_3)_3$ in the reaction chamber of either the principal or auxiliary vacuum system. The chamber was evacuated to a base pressure of less than about $1 \times 10^{-9}$ torr. The chamber walls were at room temperature. The $CH_3CH_2AuP(CH_3)_3$ starting material was fed into the reaction chamber by opening the valve between the deposition-agent ampoule—which was held at room temperature—and the chamber, while continually pumping the chamber with the turbomolecular pump. A pressure of about $4.2 \times 10^{-6}$ torr was established in the chamber for the principal vacuum system under unthrottled flowing conditions. A pressure of either about $1.3 \times 10^{-4}$ or about $0.8 \times 10^{-4}$ torr was used in the reaction chamber of the auxiliary vacuum system.

In the case of target surfaces exposed in the reaction chamber of the principal vacuum system, the exposed substrate was transferred under vacuum to the analysis chamber which was evacuated to a base pressure of approximately $2 \times 10^{-10}$ torr after the deposition was terminated. In the case of target surfaces exposed to ethyl(trimethylphosphine)gold(I) in the reaction chamber of the auxiliary vacuum system, the exposed test-specimen substrates had to be removed from the reaction chamber and exposed to the atmosphere for transfer to the analysis chamber. In general, the composition of each substrate surface was analyzed by x-ray photoelectron spectroscopy in the analysis chamber.

With the substrate at approximately 25° C., reaction with $CH_3CH_2AuP(CH_3)_3$ resulted in the deposition of a pure gold film on the test-specimen substrate when the target surface was clean, uncontaminated gold, chromium, cobalt, or copper. The chromium films on Si(111) formed by evaporation of chromium ingots were estimated to be in the range of from about 30 to about 40 Å thick based on the attenuation of the Si 2p core level peak. The use of thicker chromium films had essentially no effect upon gold film formation.

Submonolayer coverages of gold from ethyl(trimethylphosphine)gold(I) resulting from exposures of roughly $2.5 \times 10^{-4}$ torr sec on freshly prepared chromium surfaces were characterized by XPS spectroscopy. A binding energy for Au $4f_{7/2}$ of about 84.4 eV is consistent with the formation of small islands of gold on the chromium surface. Exposures of greater than $3.0 \times 10^{-2}$ torr sec generated continuous gold films with a binding energy for Au $4f_{7/2}$ of about 83.8 eV, which is essentially identical to that of pure bulk gold. An exposure of 0.24 torr sec ethyl(trimethylphosphine)gold(I) produced a film approximately 500 Å thick, giving an average deposition rate of about $2.1 \times 10^3$ Å torr$^{-1}$sec$^{-1}$ at approximately 25° C. A film approximately 850 Å thick was grown by heating the substrate to about 230° C. and exposing it to ethyl(trimethylphosphine)gold(I) for about $4.5 \times 10^{-2}$ torr sec, yielding an average deposition rate of approximately $1.9 \times 10^4$ Å torr$^{-1}$sec$^{-1}$.

Aside from traces of carbon and—in the case of deposition on copper surfaces, as discussed below—copper at the immediate surface of deposited films, from the XPS evidence it appears that the bulk of the film deposited on a copper, cobalt, chromium, or gold target surface was pure, elemental gold. Analysis by depth-profiling Auger spectroscopy detected no carbon or phosphorus in the bulk of the gold. The purity of the films was also consistent with experiments on larger three-inch silicon wafers coated with copper, cobalt, and gold for which it was determined that gold films deposited on the copper, cobalt, or gold had electrical resistivities near that of bulk gold. In particular, for specularly smooth gold films grown on the copper, cobalt, or gold at approximately 110° C., the electrical resistivity was found to be approximately $2.6 \pm 0.6$ $\mu\Omega$ cm. For comparison, bulk gold metal has a resistivity of about 2.20 $\mu\Omega$ cm.

Exposure of a surface composed of copper freshly evaporated onto a silicon-dioxide-coated silicon wafer to ethyl(trimethylphosphine)gold(I) for about $3.0 \times 10^{-2}$ torr secs at approximately 25° C. resulted in the deposition of a gold film on the copper. The XPS spectrum exhibited a Au $4f_{7/2}$ level with a binding energy of about 83.8 eV. Small peaks for the Cu $2p_{3/2}$ core level with a binding energy of about 932.6 eV remained, suggesting that a thin layer of copper was present at the surface. This layer persisted even for gold films as thick as about 3600 Å. Depth-profiling Auger spectroscopy confirmed the presence of a thin film of copper on this surface. The interdiffusion of gold and copper is a known phenomenon. The observed rate for gold deposition on copper was about $1.0 \times 10^3$ Å torr$^{-1}$sec$^{-1}$ at about 25° C. The rate observed is a factor of two slower than the rate observed for gold growth on chromium. An explanation for the slower rate is the presence of the copper over-layer.

Deposition of gold was also observed at approximately 25° C. on the target surfaces of the tantalum and molybdenum mounting hardware which had been heated under ultrahigh vacuum conditions.

When the target surface was silicon oxide, chromium oxide, cobalt oxide, copper oxide, or pyromellitic dianhydride oxydianiline (PMDA-ODA) polyimide at about 25° C., the deposition of gold from ethyl(trimethylphosphine)gold(I) was substantially inhibited.

Both 5000-Å thick silicon dioxide and PMDA-ODA polyimide films did not react at 25° C. with ethyl(trimethylphosphine)gold(I). No trace of gold nor any phosphorous-containing species was noted after exposure of up to 0.3 torr sec. The thinner approximately 40 Å thick silicon-dioxide films did react with ethyl(trimethylphosphine)gold(I) to give barely detectable amounts of gold on the surface. The Au $4f_{7/2}$ peak of the XPS spectrum was about 85.7 eV for such samples. The trace gold deposition may be occurring at defect sites in the approximately 40-Å thick silicon dioxide films, but the nature of these sites has not been determined.

Heating to approximately 150° C. initiates film growth on silicon dioxide films which are both approximately 40 and approximately 5000 Å thick. Films of PMDA-ODA polyimide must be heated to over about 400° C. to initiate gold deposition from ethyl(trimethylphosphine)gold(I). Although PMDA-ODA polyimide decomposes at approximately 400° C., it is not clear that decomposition of the polyimide film is responsible for initiation of gold deposition. Bombardment of polyimide with an argon ion beam is known to damage polyimide to an extent sufficient to make it electrically conducting. A PMDA-ODA polyimide film about 2000 Å thick was exposed for about 5 minutes to a focused argon ion beam. The pressure of argon in the ion-beam apparatus was about $1.1 \times 10^{-4}$ torr, with an ion current of about 25 mA and a potential of 2000 V. Subsequent exposure at about 25° C. to ethyl(trimethylphosphine)gold(I) for approximately 0.27 torr sec resulted in only trace amounts of gold both on and off the ion-beam target area. It seems likely that, at temperatures in excess of about 400° C., ethyl(trimethylphosphine)gold(I) is undergoing pyrolytic decomposition. A different mechanism would appear to be operating on silicon dioxide, since deposition of gold from ethyl(trimethylphosphine)gold(I) begins at about 150° C.

On silicon surfaces at approximately 25° C., reaction initially resulted in formation of a gold/silicon alloy followed by deposition of elemental gold at longer deposition times. More particularly, exposure of a cleaned Si(111) surface to $CH_3CH_2AuP(CH_3)_3$ at about $4.2 \times 10^{-6}$ torr for about 5 minutes, which corresponds to an exposure of approximately $1.3 \times 10^{-3}$ torr sec, resulted in the deposition of gold on the silicon substrate. The binding energy as measured by X-ray photoelectron spectroscopy for the Au $4f_{7/2}$ level was found to be about 84.9 eV. The initial binding energy of approximately 84.9 eV is attributed to the combined effects of Au/Si alloy formation and island formation. No $P(CH_3)_3$ nor any other phosphorous-containing species could be detected by XPS, and only a trace of carbon was present on the surface. Exposure for longer periods resulted in a changing Au/Si film composition as evidenced by a monotonic decrease in the binding energy of the Au 4f level. Eventually, for exposures greater than about $1.5 \times 10^{-2}$ torr sec, a spectrum was obtained which was dominated by elemental gold features: a Au $4f_{7/2}$ level of about 83.8 eV, with small peaks remaining for the Si 2p and Si 2s core levels. The silicon peaks are attributed to a surface-segregated gold/silicon alloy. Heating the sample to about 700° C. resulted in the formation of a gold/silicon alloy with no metallic gold remaining as evidenced by the Au $4f_{7/2}$ peak shifting to approximately 84.8 eV. The behavior observed for gold deposited from ethyl(trimethylphosphine)gold(I) is consistent with that previously reported for the direct evaporation of high purity metallic gold onto silicon substrates. No evidence was seen for room temperature molecular adsorption of ethyl(trimethylphosphine)gold(I) on this or any other of the surfaces studied.

On germanium surfaces at approximately 25° C., a gold/germanium alloy formed initially, which was followed by deposition of elemental gold at longer deposition times.

EXAMPLE 2

Example 1 was repeated for test-specimen substrates with target surfaces of freshly deposited chromium, with the exception that the reaction chamber was evacuated to a base pressure of about $1 \times 10^{-8}$ torr. No deposition of gold was observed with the test-specimen substrates at about 25° C. It is believed that highly reactive surfaces such as freshly-deposited chromium tend to become oxidized to an oxide at a sufficiently high rate that the target surface becomes catalytically inactive with respect to decomposition of ethyl(trimethylphosphine)gold(I).

EXAMPLE 3

Example 1 was repeated using test-specimen substrates with target surfaces bearing patterns of freshly-deposited chromium or copper dots on silicon dioxide or PMDA-ODA polyimide.

Exposure of the patterned surfaces of chromium dots on approximately 5000-Å-thick silicon dioxide to ethyl(trimethylphosphine)gold(I) $CH_3CH_2AuP(CH_3)_3$ in the manner described in Example 1 above at substrate temperatures in the range of from about 25° C. to about 100° C. resulted in deposition of gold selectively on the chromium dots only and essentially no gold deposition on the adjacent silicon dioxide surfaces. Other than the deposition of gold, no etching or other chemical or physical alteration of the chromium or silicon dioxide surface regions was observed. At temperatures higher than about 120° C., selectivity was lost, and gold deposited on the silicon dioxide surface regions as well as the chromium dots. By adjusting the temperature, the process could be tuned from an effectively selective gold deposition process to a blanket gold deposition process.

In the presence of adjacent PMDA-ODA polyimide surfaces, selective deposition of gold on chromium dots only could be effected at substrate temperatures in the range of from about 25° C. to about 230° C. An XPS spectrum of the target surface containing chromium dots approximately 30 Å thick and about 100μ in diameter is shown in FIG. 1(a). Core level features for both the polyimide substrate and the chromium dots are indicated in the spectrum. The composite surface was exposed to ethyl(trimethylphosphine)gold(I) at about 25° C. for approximately 15 hours, which corresponded to an exposure of about 0.23 torr sec. Gold dots about 500 Å thick were formed. An XPS spectrum of the target surface after the exposure is shown in FIG. 1(b). The features due to the polyimide substrate are evident in the spectrum of FIG. 1(b). However, the chromium peaks of FIG. 1(a) have been replaced by gold peaks, indicating that gold films now cover the dots. The deposition rate could be enhanced by heating to about 230° C. without any degradation in selectivity. Area specific Auger spectroscopy and small-spot XPS were used to quantify the selective nature of the reaction. Within the sensitivity limits of these two techniques, estimated to be about 0.01 atomic percent, no gold could be detected in the polyimide region for the temperature range of from about 25° to about 230° C.

Figure 2:
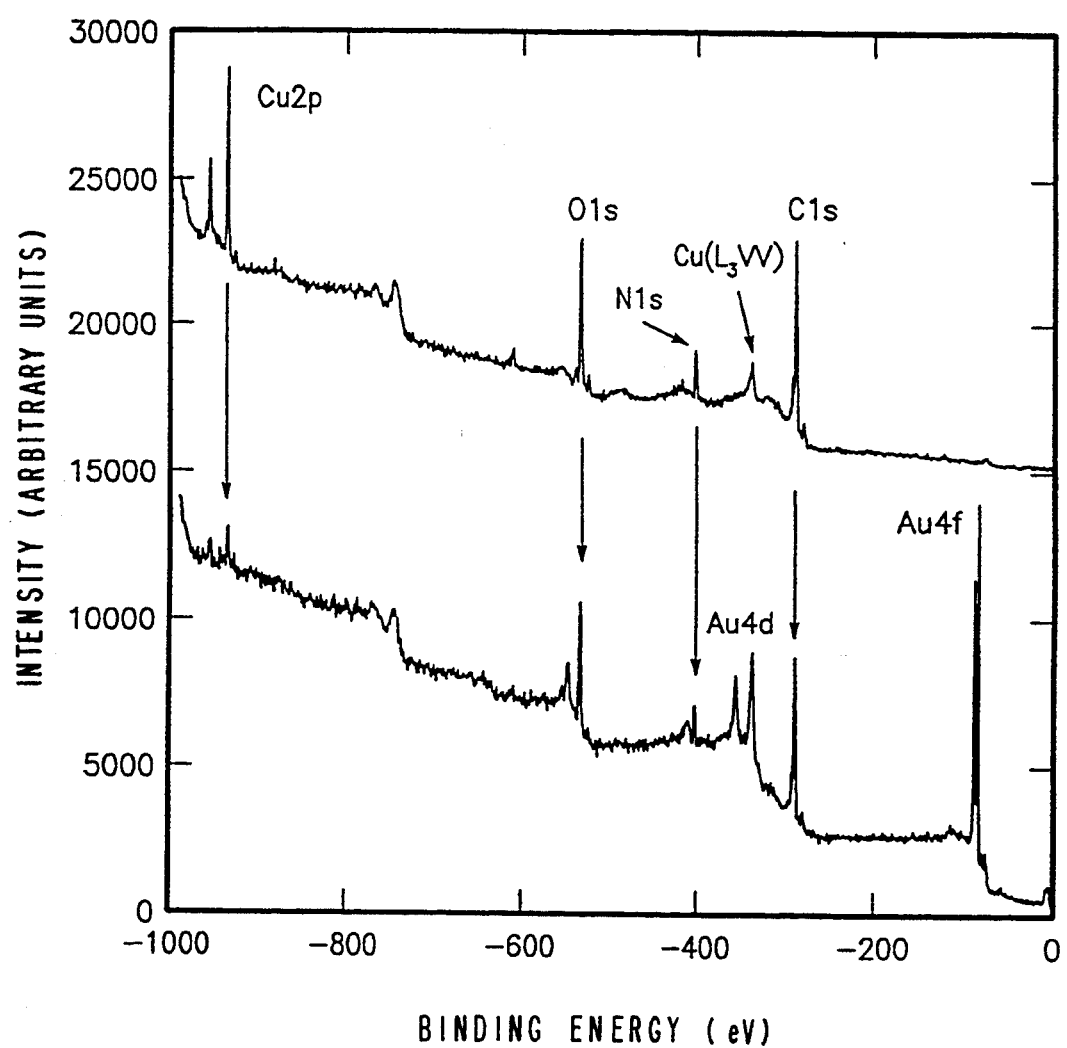
FIG. 2(a) shows an x-ray photoelectron spectrum of a patterned target surface having copper dots disposed on a layer of PMDA-ODA polyimide.
FIG. 2(b) shows an x-ray photoelectron spectrum of the patterned target surface of FIG. 2(a) after exposure to ethyl(trimethylphosphine)gold(I) at about 25° C.

A spectrum of a composite surface made up of copper dots on polyimide is shown in FIG. 2(a). An exposure of approximately $8.1 \times 10^{-2}$ torr sec of ethyl(trimethylphosphine)gold(I) at about 25° C. yielded an essentially completely selective gold film about 300 Å thick deposited on copper only, as shown in FIG. 2(b). The Cu 2p core levels indicate the presence of a copper surface layer on the deposited gold. Within about 0.01 atomic percent, no gold was found on the polyimide regions of the patterns.

EXAMPLE 4

Selective deposition of gold was carried out in a manner analogous to Example 1 using methyl(trimethylphosphine)gold(I) $CH_3AuP(CH_3)_3$ as the starting material. A pressure of approximately $1.2 \times 10^{-6}$ torr was established in the reaction chamber of the principal vacuum system under unthrottled flowing conditions when $(CH_3)AuP(CH_3)_3$ was fed into the chamber from the deposition-agent ampoule. With the substrate at about 25° C., essentially the same substrate selectivity was observed as for ethyl(trimethylphosphine)gold(I). Exposure of a chromium surface to methyl(trimethylphosphine)gold(I) for approximately $7.8 \times 10^{-2}$ torr sec resulted in a film about 150 Å thick, giving an average rate of approximately $1.9 \times 10^3$ Å torr$^{-1}$ sec$^{-1}$ at about 25° C. Substantially identical results were obtained for methyl(trimethylphosphine)gold(I) at about 25° C. for the polyimide substrates patterned with chromium as was obtained for ethyl(trimethylphosphine)gold(I); an exposure of about $7.8 \times 10^{-2}$ torr secs of methyl(trimethylphosphine)gold(I) produced gold dots approximately 150 Å thick. Again in the case of target surfaces coated with silicon dioxide approximately 40 and approximately 5000 Å thick, substantially identical results were obtained for methyl(trimethylphosphine)gold(I) as were found for ethyl(trimethylphosphine)gold(I) discussed above in Example 1.

EXAMPLE 5

Substrates with chromium, copper, cobalt, and gold target surfaces were prepared by evaporation and then exposed to air to form—in the case of chromium, copper, and cobalt—a native oxide on the surfaces, and—in the case of gold—an air-contaminated surface. The target surfaces were then exposed to a hydrogen plasma generated in an electron cyclotron resonance source under ultrahigh vacuum conditions.

The plasma was generated using a plasma generator commercially available from ASTeX Applied Science and Technology, Inc. of Woburn, Mass. under the trade designation "Model CECR 0.25 Compact ECR Plasma Source." The hydrogen plasma was generated with a power of about 260 watts, a current of about 20 amps and a hydrogen pressure of about 10 mtorr.

Target surfaces of the oxidized copper and cobalt and air-contaminated gold were exposed to the hydrogen plasma for periods from about 15 seconds to about 15 minutes. Target surfaces of the oxidized chromium were exposed to the plasma for about 45 minutes. The substrates were subsequently transferred into the reaction chamber under ultrahigh vacuum. Gold depositions from ethyl(trimethylphosphine)gold(I) could be performed essentially as usual on the plasma-cleaned target surfaces. When target surfaces of oxidized chromium were exposed to the hydrogen plasma for only about 15 minutes, gold deposition from ethyl(trimethylphosphine)gold(I) was not successful.

Substantially identical results were obtained when similarily air-exposed target surfaces of copper and gold were subjected to an argon plasma of substantially the same power level, current, and gas pressure as the hydrogen plasma.

EXAMPLE 6

Substrates with chromium and copper target surfaces were prepared by evaporation and then exposed to air to form a native oxide on the surfaces. Each target surface was then subjected to an argon ion beam bombardment to sputter clean an area of the surface. Exposure of the target surfaces to ethyl(trimethylphosphine)gold(I) at about 25° C. resulted in deposition of gold in the sputter cleaned areas. Essentially no gold deposition could be initiated on the adjacent uncleaned surfaces under the same conditions.

EXAMPLE 7

Two test-specimen substrates with copper target surfaces were prepared by evaporation and then exposed to air to form a native oxide on the surfaces. One of the test specimen substrates was then heated to about 200° C. in the presence of hydrogen at a pressure of about 10 mtorr. Subsequent exposure of the target surface to ethyl(trimethylphosphine)gold(I) at about 25° C. resulted in deposition of gold. Essentially no gold deposition could be initiated on the uncleaned copper target surface of the other test-specimen substrate upon exposure to ethyl(trimethylphosphine)gold(I) under essentially the same conditions.

EXAMPLE 8

In the following example, catalytically activated target surfaces were treated with Lewis bases and Lewis acids and the effect on the deposition of gold from ethyl(trimethylphosphine)gold(I) determined.

Figure 3:
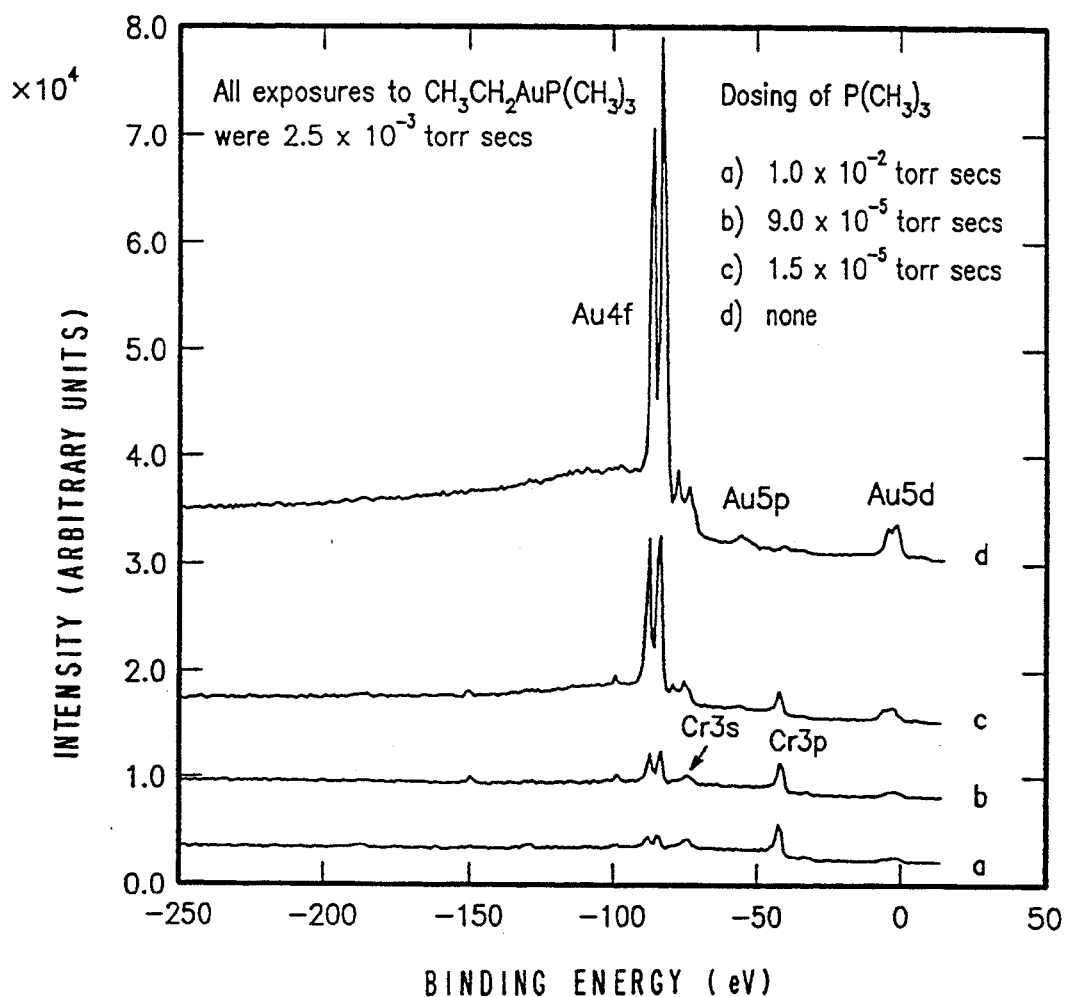
FIGS. 3(a), 3(b) and 3(c) show x-ray photoelectron spectra of target surfaces of freshly-deposited chromium exposed to various dosages of trimethylphosphine prior to exposure to ethyl(trimethylphosphine)gold(I).
FIG. 3(d) shows an x-ray photoelectron spectrum of a control surface of freshly-deposited chromium which was not exposed to trimethylphosphine prior to exposure to ethyl(trimethylphosphine)gold(I).

A target surface of freshly-deposited chromium was pretreated with varying amounts of the Lewis base trimethylphosphine $P(CH_3)_3$. As shown in FIG. 3, gold coverage after exposure to about $2.5 \times 10^{-3}$ torr sec of ethyl(trimethylphosphine)gold(I) is only submonolayer for a chromium surface previously saturated with $P(CH_3)_3$. Exposure of the chromium surface to $P(CH_3)_3$ results in significant inhibition, but even saturating the surface does not stop the eventual formation of a continuation gold film. After exposure for about 2 hours, which represents an exposure of about $3.0 \times 10^{-2}$ torr sec, all samples had formed a film of gold thicker than about 40 Å.

From x-ray photoelectron spectroscopy and depth profiling Auger spectroscopy, it was determined that essentially no trimethylphosphine is trapped in the bulk of gold films grown on chromium from ethyl(trimethylphosphine)gold(I), whether or not the chromium is pre-dosed with $P(CH_3)_3$. Moreover, gold films grown with no pretreatment with $P(CH_3)_3$ were found to have essentially no detectable signal for phosphorus and carbon at the chromium/gold interface by depth profiling Auger spectroscopy. However, depth-profiling Auger spectroscopy showed that significant amounts of carbon and phosphorus are buried at the chromium/gold interface if the chromium surface had been saturated with trimethylphosphine prior to reaction with ethyl(trimethylphosphine)gold(I). The phosphorus/carbon ratio was 1 to $3.4 \pm 0.3$, which is slightly higher in carbon than the 1:3 ratio expected for trimethylphosphine.

Figure 4:
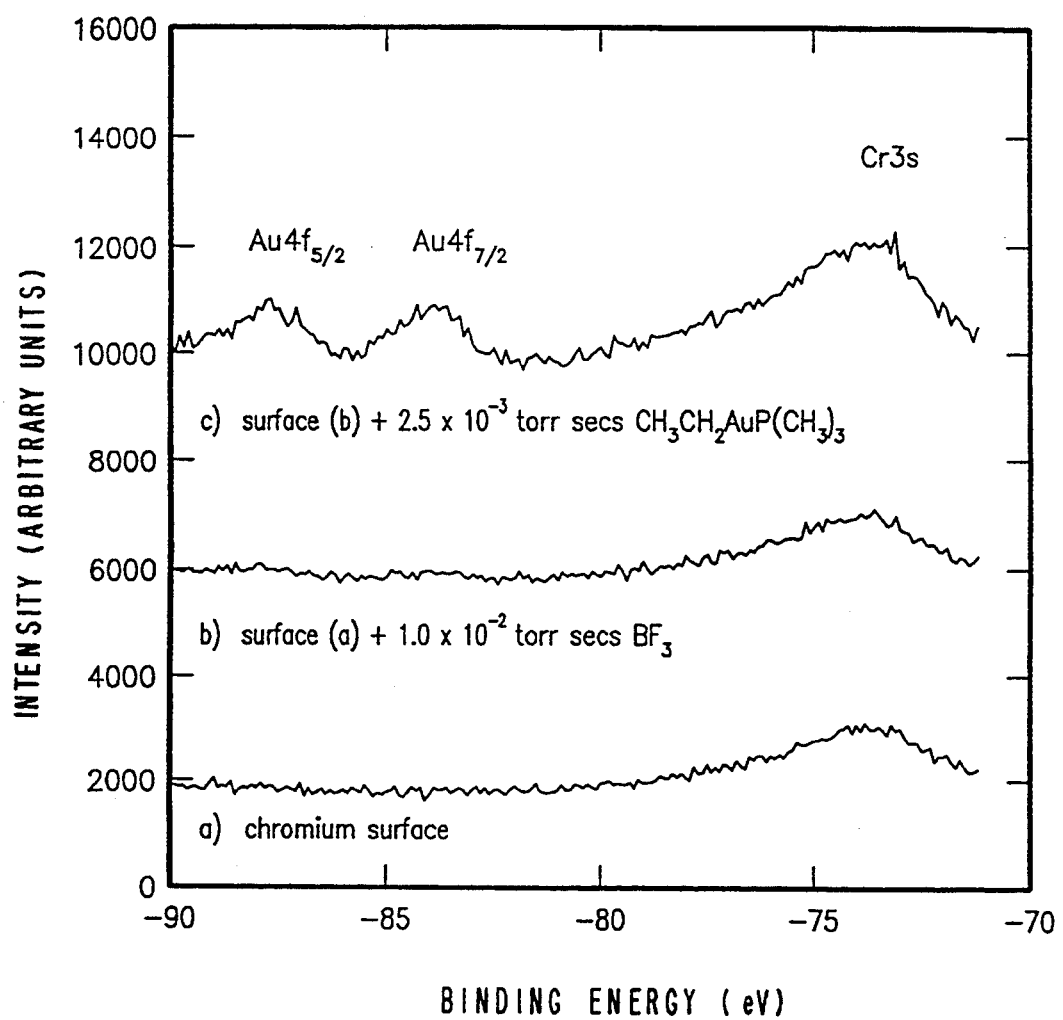
FIG. 4(a) shows an x-ray photoelectron spectrum of a target surface of freshly-deposited chromium.
FIG. 4(b) shows an x-ray photoelectron spectrum of a target surface of freshly-deposited chromium which was exposed to boron trifluoride.
FIG. 4(c) shows an x-ray photoelectron spectrum of a target surface of freshly-deposited chromium which was exposed first to boron trifluoride and then to ethyl(trimethylphosphine)gold(I).

Target surfaces composed of freshly-deposited chromium were exposed to the Lewis acid boron trifluoride $BF_3$ at a pressure of about $1 \times 10^{-4}$ torr for roughly 100 seconds. Exposures of $BF_3$ at this pressure for about 30 seconds were sufficient to saturate the surface. A subsequent exposure of $2.5 \times 10^{-3}$ torr sec to ethyl(trimethylphosphine)gold(I) resulted in a small amount of gold depositing on the surface, as may be seen in FIG. 4. Approximately half the amount of gold was deposited on the boron-trifluoride-saturated surface as was deposited for the same exposure of ethyl(trimethylphosphine)gold(I) on a trimethylphosphine-saturated surface. Exposure of a boron trifluoride-saturated chromium surface to approximately $3 \times 10^{-2}$ torr sec of ethyl(trimethylphosphine)gold(I) still results in submonolayer coverage of the chromium surface, as shown by an XPS spectrum of the surface. The binding energy for Au $4f_{7/2}$ of about 84.0 eV is approximately 0.2 eV shifted from the value for bulk gold, indicating that islands of gold are present. By way of comparison, the trimethylphosphine saturated surface reacts with ethyl(trimethylphosphine)gold(I) at an exposure of approximately $3 \times 10^{-2}$ torr sec to give a gold film of greater than about 40 Å thickness with a core level shift for Au $4f_{7/2}$ of approximately 83.8 eV. In the absence of any pretreatment of the surface, these conditions would have generated a continuous gold film approximately 60 Å thick.

The inhibiting effect of the Lewis acid $BF_3$ can be partially reversed by heating the $BF_3$-covered surface to about 350° C. Such heating results in changes in the XPS spectrum. Specifically, the binding energy for the B 1s level shifts about +0.4 eV and a second, very broad B 1s peak begins to grow in at about 190 eV. The F 1s peak decreases in intensity by approximately a factor of two and shifts by about +1.2 eV. The growth of B 1s peaks in the 190 eV region suggests the formation of chromium borides and/or elemental boron. Subsequent exposure to ethyl(trimethylphosphine)gold(I) results in gold film growth at a rate intermediate between that of the clean chromium surface and the boron-trifluoride-saturated surface.

Neither the Lewis base trimethylphosphine $P(CH_3)_3$ nor the Lewis acid boron trifluoride $BF_3$ absorbed in detectable quantities on a gold surface at about 25° C. While both species do bind to copper, they do not slow significantly the rate of gold film formation. Thus, the inhibitory behavior of these species is somewhat selective, allowing continued growth on copper or an existing gold surface, but greatly reducing the rate of gold deposition on chromium.

It is not intended to limit the present invention to the specific embodiments described above. It is recognized that changes may be made in the materials and processes specifically described herein without departing from the scope and teaching of the instant invention, and it is intended to encompass all other embodiments, alternatives, and modifications consistent with the invention.

We claim:

1. A chemical-vapor-deposition method for selectively depositing gold onto a catalytically-activated region on a surface of a workpiece in the presence of a catalytically-inactive region on the surface, comprising the steps of:
   (a) placing the workpiece in a vacuum chamber, a surface of the workpiece defining a target surface;
   (b) evacuating the vacuum chamber to a base pressure equal to or less than a catalyst-activity-preserving upper pressure limit to eliminate effectively gaseous catalyst-deactivating contaminants from the vacuum chamber;
   (c) altering the surface composition of at least one region of the target surface to produce a catalytically-activated region on the target surface, at least one region of the target surface disjoint from the catalytically-activated region being a catalytically-inactive region;
   (d) introducing a gaseous gold-containing compound into the vacuum chamber to expose the target surface of the workpiece to the compound, the compound being an alkylate (trialkylphosphine) gold compound;
   (e) essentially continuously evacuating the vacuum chamber during exposure of the target surface to the gold-containing compound to maintain the vacuum chamber effectively free of gaseous catalyst-deactivating contaminants and to sweep gaseous reaction products from the vacuum chamber, the vacuum chamber being maintained effectively free of gaseous reducing agents during exposure of the target surface to the gold-containing compound; and
   (f) maintaining the target surface of the workpiece at a selective-deposition temperature effective to induce the gaseous gold-containing compound to deposit gold on the catalytically-activated regions of the target surface and to inhibit the compound from depositing gold on the catalytically-inactive regions of the target surface subsequent to altering the surface composition of at least one region as the target surface to produce a catalytically activated region in step (c) and prior to introducing the gaseous gold-containing compound into the vacuum chamber in step (d), introducing a gaseous reversible-catalysts-inhibition agent into the vacuum chamber to expose the target surface of the workpiece to the agent to inhibit the catalytic activity of at least a portion of the catalytically activated region.

2. The method according to claim 1 in which the alkylated (trialkylphosphine)gold compound has the formula $RAuPR'_3$, where R is a methyl, ethyl, n-propyl, isopropyl, or t-butyl group and R' is a methyl or ethyl group.

3. The method according to claim 2 in which the alkylated (trialkylphosphine)gold compound is selected from the group consisting of methyl(trimethylphosphine)gold(I) and ethyl(trimethylphosphine)gold(I).

4. The method according to claim 1 in which the alkylated (trialkylphosphine)gold compound has the formula $R_3AuPR'_3$, where R is a methyl or ethyl group and R' is a methyl or ethyl group.

5. The method according to claim 4 in which the alkylated (trialkylphosphine)gold compound is trimethyl(trimethylphosphine)gold(III).

6. The method according to claim 1 in which the catalytically-activated regions of the target surface of the workpiece comprise regions composed of a metal selected from the group consisting of gold, chromium, cobalt, and copper.

7. The method according to claim 6 in which the catalytically-inactive regions of the target surface of the workpiece comprise regions composed of silicon dioxide.

8. The method according to claim 7 in which the catalytically-activated regions of the target surface of the workpiece comprise regions composed of chromium, the alkylated (trialkylphosphine)gold compound is selected from the group consisting of methyl(trimethylphosphine)gold(I) and ethyl(trimethylphosphine)gold(I), and the target surface of the workpiece is maintained at a selective-deposition temperature in the range of from about 25° C. to about 100° C.

9. The method according to claim 1 in which the catalytically-inactive regions of the target surface of the workpiece comprise regions composed of a polyimide polymer.

10. The method according to claim 9 in which the polyimide polymer is pyromellitic dianhydride oxydianiline polyimide polymer.

11. The method according to claim 10 in which the catalytically-activated regions of the target surface of the workpiece comprise regions composed of chromium, the alkylated (trialkylphosphine)gold compound is selectd from the group consisting of methyl(trimethylphosphine)gold(I) and ethyl(trimethylphosphine)gold(I), and the target surface of the workpiece is maintained at a selective-deposition temperature in the range of from about 25° C. to about 230° C.

12. The method according to claim 1 further including the steps of:
positioning a shadow mask proximate to and in registry with the target surface at a position between the target surface and a metal vapor source in the vacuum chamber, the shadow mask having openings passing through the mask which correspond to a desired gold-deposition pattern on the target surface; and
heating a metal in the metal vapor source to vaporize the metal, vaporized metal passing through the openings in the shadow mask and depositing on the target surface as a layer of metal catalyst in the form of the desired gold-deposition pattern, the layer of metal catalyst in the form of the gold-deposition pattern defining the catalytically activated region of the target surface.

13. The method according to claim 1 in which the target surface of the workpiece includes a layer of a catalytically-activatable metal patterned in the form of a desired gold-deposition pattern, the patterned metal layer having a coating of a native oxide or other catalysis-deactivating contaminant after placement of the workpiece in the vacuum chamber, and in which the step (c) of altering the surface composition of at least one region of the target surface to produce a catalytically-activated region on the target surface includes the steps of
(c.1) generating a plasma in the vacuum chamber; and
(c.2) subjecting the target surface of the workpiece to the plasma for a time sufficient to remove sufficient native oxide or other contaminants from the patterned metal layer to activate catalytically the metal layer, the patterned metal layer subjected to the plasma defining the catalytically-activated region of the target surface of the workpiece.

14. The method according to claim 13 in which the catalytically-activatable metal is selected from the group consisting of gold, copper, cobalt, and chromium and the plasma is a hydrogen plasma or an argon plasma, generated with an electron cyclotron resonance source.

15. The method according to claim 1 in which the target surface of the workpiece includes a layer of a catalytically-activatable metal patterned in the form of a desired gold-deposition pattern, the patterned metal layer having a coating of a native oxide or other catalysis-deactivating contaminant after placement of the workpiece in the vacuum chamber, and in which the step (c) of altering the surface composition of at least one region of the target surface to produce a catalytically-activated region on the target surface includes the steps of:
(c.1) generating an ion beam and directing it into the vacuum chamber; and
(c.2) subjecting the target surface of the workpiece to bombardment by the ion beam for a time sufficient to remove sufficient native oxide or other contaminants from the patterned metal layer to activate catalytically the metal layer, the patterned metal layer subjected to the ion-beam bombardment defining the catalytically-activated region of the target surface of the workpiece.

16. The method according to claim 15 in which the catalytically-activatable metal is selected from the group consisting of gold, copper, cobalt, and chromium and the ion beam is an argon ion beam.

17. The method according to claim 1 in which the target surface of the workpiece includes a layer of a catalytically-activatable metal patterned in the form of a desired gold-deposition pattern, the patterned metal layer having a coating of a native oxide or other catalysis-deactivating contaminant after placement of the workpiece in the vacuum chamber, and in which the step (c) of altering the surface composition of at least one region of the target surface to produce a catalytically-activated region on the target surface includes the steps of:
(c.1) introducing a chemically active cleaning agent into the vacuum chamber; and
(c.2) subjecting the target surface of the workpiece to the chemically active cleaning agent for a time sufficient to remove sufficient native oxide or other contaminants from the patterned metal layer to activate catalytically the metal layer, the patterned metal layer subjected to the cleaning agent defining the catalytically-activated region of the target surface of the workpiece.

18. The method according to claim 17 in which the catalytically-activatable metal is copper and the chemically-active cleaning agent is hydrogen.

19. The method according to claim 1 in which the reversible-catalysis-inhibition agent is a Lewis acid or a Lewis base.

20. The method according to claim 19 in which the reversible-catalysis-inhibition agent is selected from the group consisting of the Lewis acids boron trifluoride $BF_3$ and triethyl boron $B(CH_2CH_3)_3$ and the Lewis base trimethylphosphine $P(CH_3)_3$.

* * * * *